United States Patent [19]

Hanson et al.

[11] Patent Number: 4,695,258
[45] Date of Patent: Sep. 22, 1987

[54] CONNECTOR ASSEMBLY FOR ELECTRICALLY CONNECTING FLEXIBLE AND RIGID PRINTED CIRCUITS

[75] Inventors: Daniel R. Hanson; Ludwig D. Nesheim, both of Minneapolis, Minn.

[73] Assignee: Cherne Industries, Inc., Minneapolis, Minn.

[21] Appl. No.: 939,715

[22] Filed: Dec. 9, 1986

[51] Int. Cl.[4] .............................................. H01R 9/09
[52] U.S. Cl. ...................................... 439/67; 439/329
[58] Field of Search ............ 339/17 F, 17 M, 17 LM, 339/59 M, 61 M, 74 R, 176 MF, DIG. 3, 75 MP, 75 M

[56] References Cited

U.S. PATENT DOCUMENTS

| | | | |
|---|---|---|---|
| 3,114,587 | 12/1963 | Herrmann | 339/17 F |
| 3,353,141 | 11/1967 | Budai | 339/17 F |
| 4,111,510 | 9/1978 | Zurcher | 339/17 |
| 4,278,314 | 7/1981 | Moser et al. | 339/99 |
| 4,344,662 | 8/1982 | Dalamangas et al. | 339/59 |
| 4,401,352 | 8/1983 | Heisey | 339/17 |
| 4,402,562 | 9/1983 | Sado | 339/61 |
| 4,416,497 | 11/1983 | Brandsness et al. | 339/17 |
| 4,437,718 | 3/1984 | Selinko | 339/61 |
| 4,445,735 | 5/1984 | Bonnefoy | 339/17 |
| 4,477,137 | 10/1984 | Ayer | 339/17 F |
| 4,488,771 | 12/1984 | Koford | 339/278 |
| 4,508,990 | 4/1985 | Essinger | 313/50 |
| 4,519,659 | 5/1985 | Shiino et al. | 339/176 MF |
| 4,531,793 | 7/1985 | Hochgesang | 339/17 |
| 4,542,564 | 9/1985 | Mount | 29/25.35 |
| 4,639,063 | 1/1987 | Mueller | 339/17 F |

OTHER PUBLICATIONS

PCK Elastomerics, Inc., Technical Data Sheet for Silver Stax Elastomeric Connectors.
PCK Elastomerics, Inc., Moe-Flex Circuit Connection Unit, PCK 0051, 1983.
PCK Elastomerics, Inc., Flat Cable Moe Connector, PCK 0135, 1984.
PCK Elastomerics, Inc., Flat Cable/Flat Moe Connection to PCB, PCK 0028, 1983.

Primary Examiner—Neil Abrams
Attorney, Agent, or Firm—Anthony G. Eggink

[57] ABSTRACT

The connector assembly is for connecting the conductive network of a flexible printed circuit to the conductive network of a rigid printed circuit board. The connector assembly comprises an alignment body structure mountable on the printed circuit and for positioning the flexible printed circuit for electrical communication with the rigid printed circuit. The alignment structure has a central aperture in alignment with the printed circuit contacts and a horizontal insertion aperture for ingress and egress of the flexible printed circuit in the plane of the rigid printed circuit. The connector assembly further comprises an elastomeric conductor disposed within the alignment structure so that the elastomeric conductor is between the communicative portions of the flexible printed circuit and the rigid printed circuit. A clamping structure is disposed within the alignment structure and which is operable in the central aperture to releasably urge the contact portions of the flexible circuit into communicative contact with the elastomeric conductor and the aligned contacts of the circuit board.

13 Claims, 8 Drawing Figures

CONNECTOR ASSEMBLY FOR ELECTRICALLY CONNECTING FLEXIBLE AND RIGID PRINTED CIRCUITS

BACKGROUND OF THE INVENTION

This invention relates to connector assemblies and more particularly to devices for electrically connecting flexible printed circuit conduction networks to those of rigid printed circuit boards.

Flexible circuits are being used with increased frequency in various electronic and electrical arts. And, particularly, these flexible circuits are being used in conjunction with rigid circuit boards.

In the medical electronic art, for example, the need exists to electrically communicate the conductive network contacts of flexible circuits to the conductive network contacts of rigid printed circuit boards of medical apparatus or their respective rigid connectors. However, most connector art known deals with the electrical communication between rigid circuitry.

In the past, connectors have been used and proposed to electrically connect flexible circuits to rigid circuits, and some of these prior art connectors utilize elastomeric conductive elements. However, these connectors are generally complex, difficult to construct and use, and are inefficient. Specifically, some prior art connectors are not reuseable or hand-operable, and do not provide strain relief at the point of contact connection. They additionally do not allow an aligned connection of the flexible circuit at zero insertion force or do not allow connection of two circuits in the same or a parallel plane.

Despite the need for a connector assembly in the electronic art which provides a fast, reliable electrical connection between flexible and rigid circuits, which is simple to manufacture and use, which is reusable, and which overcomes the limitations and problems of the prior art, none insofar as is known has been proposed or developed.

Accordingly, it is an object of the present invention to provide a compact, reusable, hand-operable connector assembly for electrically connecting flexible printed circuits to rigid printed circuit boards. It is also an object of this invention to provide a readily releasible connector assembly. Another object of the invention is to provide a connector assembly which provides strain relief and which does not damage the circuit's conductive networks or their electrical contacts during the process of connection. It is a further object of the present invention to provide an assembly which allows for the co-planar connection of a flexible circuit to a rigid circuit.

Particular problems and difficulties exist when connecting flexible circuits to rigid circuits. Flexible circuits are delicate in nature and, therefor, the means of connecting such a circuit is prefereably one which minimizes the amount of external force required to connect and align the flexible circuit's terminal end in a connection device. Additionally, it is imperative that the terminal end of the flexible circuit be quickly and accurately aligned for electrical communication with the contacts of the rigid circuitry.

The connector assembly of this invention provides for low resistance connection of a plurality of conductive circuit paths on the flexible and rigid printed circuits while minimizing cross talk and interference. The connector assembly also provides a uniform, biased clamping force across all connected circuit paths to yield a reliable connection while protecting the printed circuit paths and contacts of the flexible and rigid printed circuits.

The connector assembly is usable to connect flexible electrode devices having multiple electrodes to other electronic apparatus. The connector assembly is particularly useful for connecting a flexible medical electrode assembly to a multiple lead cable via a rigid printed circuit board interface having associated electronic components located thereon, for example medical current limiters or other patient protection devices.

SUMMARY OF THE INVENTION

The connector assembly of the present invention provides an uncomplicated, easy to use system for connecting flexible printed circuits to rigid printed circuit boards. The connector assembly allows connection of the flexible printed circuit in a plane parallel to the plane of the rigid printed circuit. The connector assembly further allows such connection at zero insertion force. The connector assembly also provides strain relief at the connection area of the flexible printed circuit to the rigid printed circuit.

The connector assembly is for connecting the conductive network of a flexible printed circuit to the conductive network of a rigid printed circuit board by their respective contacts or contact areas and is inexpensive to manufacture and use. The connector assembly comprises an alignment body structure, an elastomeric conductor and releasable clamping means.

The alignment body structure is a rectangular, non-conductive, rigid structure having a central void and an insertion aperture. The body structure is mountable to a printed circuit board in alignment with its conductive contacts. The central void or aperture is open to the bottom surface of the alignment structure and extends vertically inward. The insertion aperture is for receiving the flexible printed circuit and is disposed in a frontal surface of the alignment body structure and extends inwardly to open at a right angle in the central void. The alignment body structure has means to mount its bottom surface on the rigid printed circuit board so that the rigid printed circuit board contacts are exposed to the central void.

The elastomeric conductor has a rectangular configuration and has vertically conductive layers sandwiched between alternating non-conductive layers. The elastomeric conductor is disposed in the bottom of the central void so that it communicates with the rigid printed circuit board contacts.

The clamping structure of the assembly is hand-operable and has a clamping block disposed and adjustably moveable within the central void and a linear force means which is operable on the clamping block to hold and release the flexible circuit. The clamping structure urges the clamping block downward in the central aperture to compressingly hold the inserted flexible printed circuit in aligned contact with the elastomeric electrical connector and the conductive contacts of the circuit board.

These and other benefits of this invention will become clear from the following description by reference to the drawings.

DESCRIPTION OF THE PREFERRED EMBODIMENTS

Figure 1:
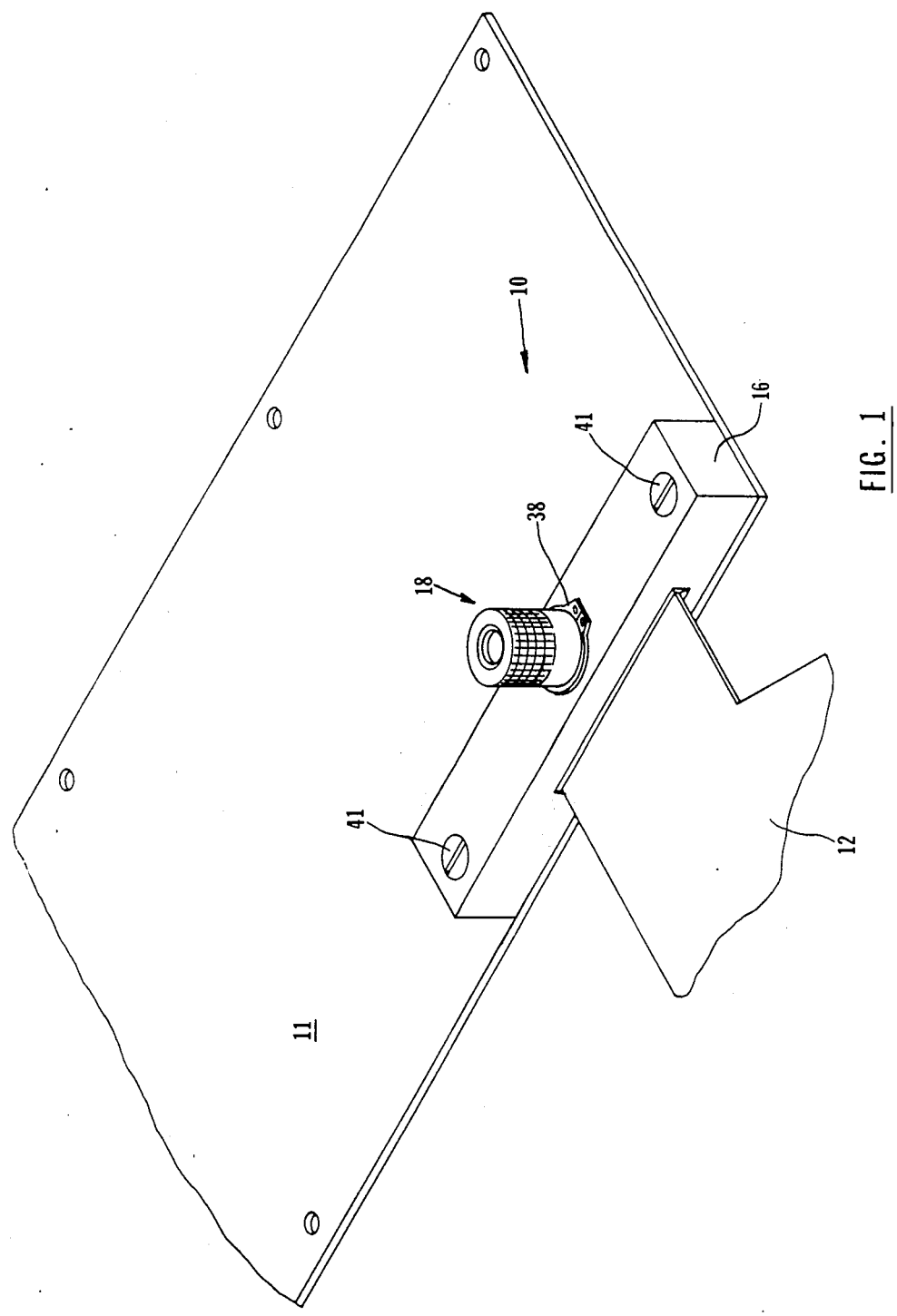
FIG. 1 shows the connector assembly of the present invention in an operative position connecting a flexible circuit to a rigid circuit.

FIG. 1 shows the connector assembly 10 of the present invention in an operative position mounted on a rigid printed circuit board 11. The assembly is for electrically connecting a flexible printed circuit 12 to the rigid printed circuit or circuit board 11. The connector assembly 10 comprises a body structure 16, an elastomeric electrical connector 17, shown in FIG. 2, and a clamping assembly 18.

Figure 2:
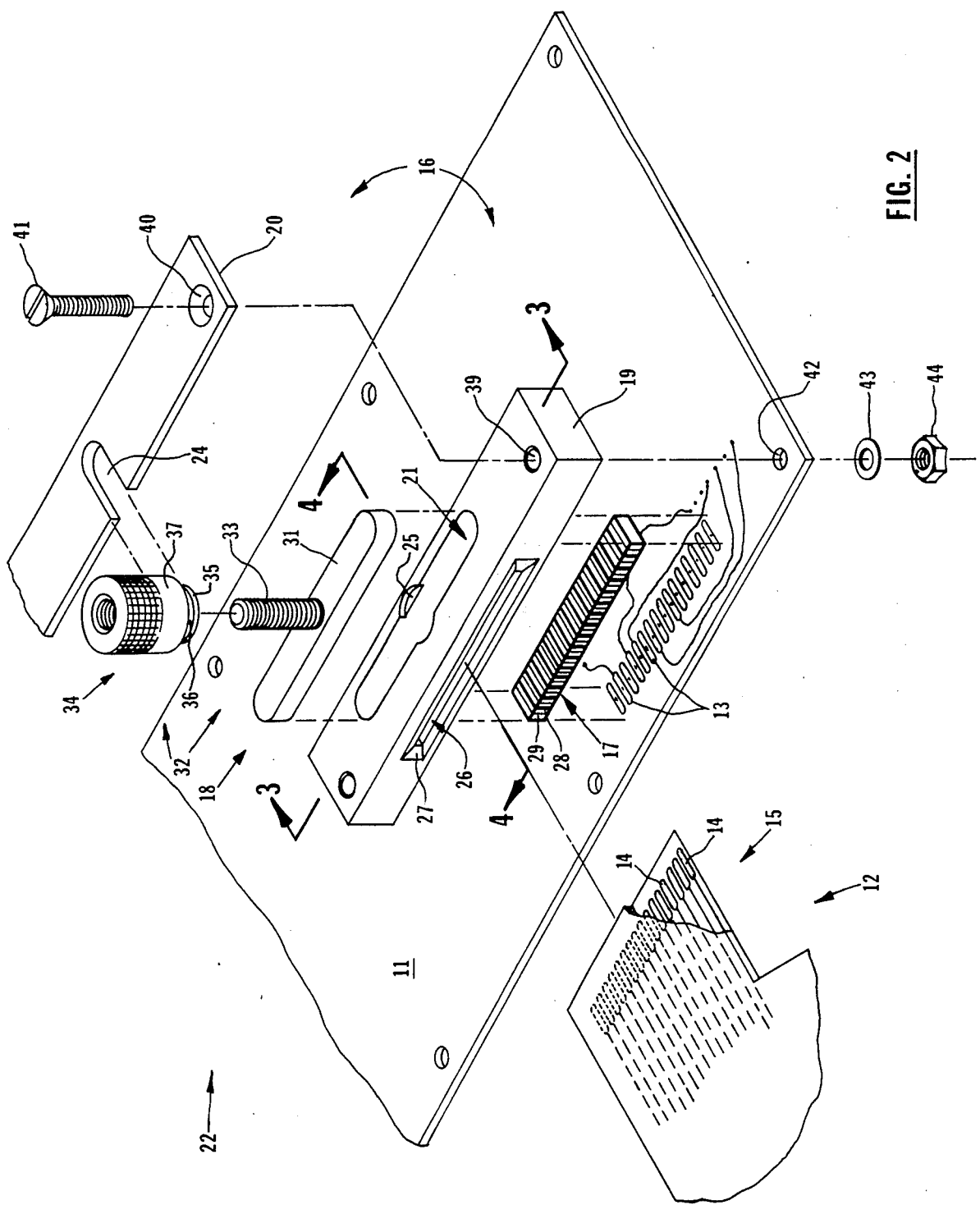
FIG. 2 is a perspective view of an embodiment of the connector assembly of the present invention with its component elements separated for clarity.

FIG. 2 shows one embodiment of the assembly 22 of the present invention with its various elements in a position for mounting on the rigid printed circuit board 11. The body or housing structure 16 is shown to be rectangular, elongated and generally planar in construction. It is shown to have a two-piece configuration consisting of a base structure 19 and an upper plate 20. Alternatively, as is shown in FIGS. 1, 5, 6, 7 and 8, the body structure 16 may have a one-piece moulded construction composed of a rigid, non-conductive substance, such as plastic. The body structure 16 is mountable on the rigid printed circuit board 11 via screws 41 which extend through a circuit board aperture 42 and which couple with washer 43 and nut 44. This configuration is for retaining the remaining elements of the connector assemblies, described below, in an operative position and for aligning the flexible printed circuit conductive network contacts 14 and rigid printed circuit board conductive network contacts 13 in an aligned position for electrical communication. The horizontal dimensions of the body structure 16 are thus dependent upon the horizontal dimensions of the flexible and rigid circuits 12 and 11 and their respective contacts 14 and 13. The vertical dimension of the housing structure 16 is dependent on the vertical dimension of the flexible printed circuit terminal 15.

Referring to FIG. 2, the base portion 19 is rectangular, generally elongated and planar, and is composed of a non-conductive material such as plastic. The base 19 has a vertical tracking cavity 21, a horizontal insertion aperture or slot 26 and linear force jack seating notches 25. It further has apertures 39 for insertion of the screws 41 therethrough for mounting the assembly 22 to the circuit board 11.

Figure 3:
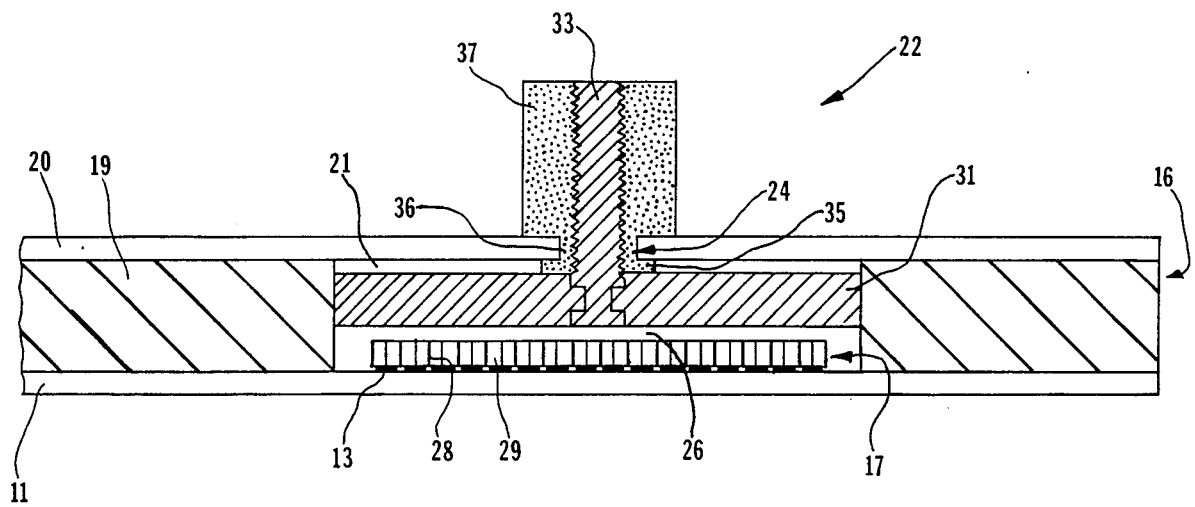
FIG. 3 is a cross-sectional view of the connector assembly embodiment shown in FIG. 2 along line 3—3.
Figure 6:
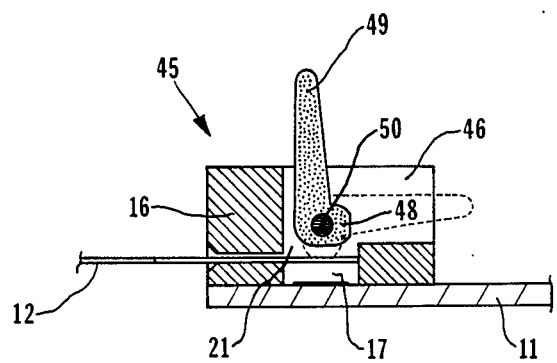
FIG. 6 is a cross-sectional view of the connector assembly embodiment shown in FIG. 5 along line 6—6.
Figure 8:
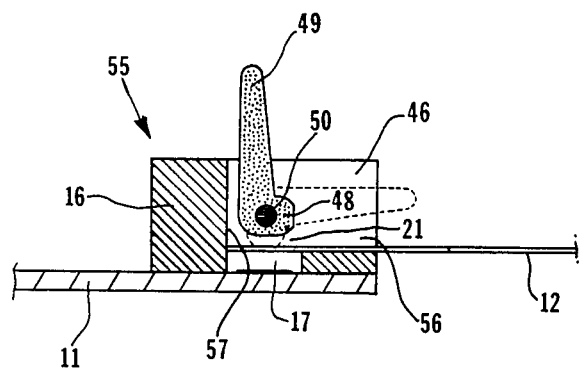
FIG. 8 is a cross-sectional view of the connector assembly embodiment shown along line 8—8 in FIG. 7.

Referring also to FIGS. 3, 6 and 8, the vertical tracking or internal cavity 21 is a vertically disposed void or aperture extending from the top surface to the bottom surface of the base 19 or extending upwardly in body structure 16. The vertical tracking cavity 21 may be only partially open to the top surface of the body structure 16 for extension of the clamping structure 18, as shown in FIG. 1. The horizontal dimensions of the vertical tracking cavity 21 are generally coextensive with the surface area of the rigid printed circuit board contacts 13. The vertical tracking cavity 21 is for exposing and aligning the rigid and printed circuit contacts 13 and 14 for communication.

FIGS. 5 through 8 show embodiments 45 and 55 of the connector assembly having cam actuated clamping assemblies 47. In these embodiments, the linear tracking or internal cavity 21 has a horizontal cavity 46 in communication therewith which accomodates the engagement of the cam actuated clamp assembly 47.

The horizontal insertion aperture 26 is an elongated, horizontally disposed aperture or slot in the base 19 and which extends from the front surface to open into the vertical tracking cavity 21, preferably at a right angle. Its horizontal and vertical dimensions are at least equivalent to those of the flexible printed circuit terminal 15 cross-section. A vertical dimension of approximately twice the thickness of the flexible circuit terminal 15 is preferable. The horizontal insertion aperture 26 is for ingress and egress of the flexible printed circuit terminal 15, at zero insertion force, into and from the body structure 16 and for exposure thereof in the vertical tracking cavity 21 for electrical connection to the rigid printed circuit contacts 13 via the elastomeric electrical connector 17. The horizontal insertion aperture 26 is preferably flaired outwardly on the front surface of the body structure 16 to form guide grooves 27. The guide grooves 27 permit improved insertion and alignment of the flexible printed circuit terminal 15.

Figure 4:
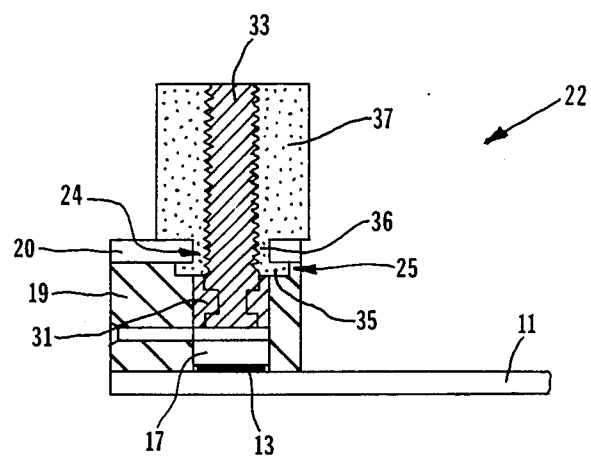
FIG. 4 is a cross-sectional view of the connector assembly shown in FIG. 2 along line 4—4.

Referring also to FIG. 4, the linear force jack or base portion seating notches 25 are semicircular grooves at the top of opposing interior walls of the vertical tracking cavity 21. The linear force jack seating notches 25 secures elements of the clamping assembly 18 from linear downward movement.

The upper plate 20 is substantially planar in configuration and is coextensive with the top surface of the base 19. It is thin and composed of metal or a like rigid substance. The upper plate 20 has a linear force jack retention slot or aperture 24 disposed near its center for alignment over the vertical tracking cavity 21. It further has apertures 40 for extension of screws 41 therethrough. The linear force jack or screw member retention slot 24 also secures elements of the clamping assembly 18 from linear upward movement.

The elastomeric electrical connector 17 is a high density, layered elastomeric electrical connector. An example of such a connector is the Silver STAX, manufactured by PCK Elastomerics, Inc., Hatboro, PA. It has a plurality of vertically conductive layers 28 which are separated by non-conductive layers 29. The conductive layers 28 have a low resistance and are preferably silver impregnated layers of silicone which are not subject to silver migration. The non-conductive layers 29 are preferably silicone in composition. Importantly, the elastomeric electrical connector is compressible and resilient.

Again referring to FIGS. 3 and 4, the elastomeric electrical connector 17 is preferably rectangular in configuration. The elastomeric connector 17 has horizontal dimensions generally coextensive or equal with those of the vertical tracking cavity 21 to provide conductive pathways between the flexible printed circuit contacts 14 and the rigid printed circuit board contacts 13. The elastomeric electrical connector 17 has a vertical dimension generally equivalent to the distance between the bottom opening of the vertical tracking cavity 21 and the opening of the horizontal insertion aperture 26 in the side of the vertical tracking cavity 21. The elastomeric electrical connector 17 is disposed in the vertical tracking cavity 21, immediately adjacent to its bottom opening and below the opening of the horizontal insertion aperture 26 in the side of the vertical tracking cavity 21. The elastomeric electrical connector 17 is positioned between the contacts 14 and 13, and has its conductive and non-conductive layers 28 and 29 aligned perpendicular to the array of contacts 14 and 13, as is particularly shown in FIG. 3, so that each conductive layer 28 can only establish electrical contact between one flexible printed circuit contact 14 and one rigid printed circuit board contact 13. A connection density of at least 200 conductive layers 28 per inch of elastomeric electrical connector 17 will provide redundant electrical connections between contacts 14 and 13 in most applications. However, the density of these layers is dependent upon the size and separation of the contacts 13 and 14.

As is further shown in FIG. 2, the clamping assembly 18 has a shoe member 31 and a screw actuated linear force jack 32. Alternatively, the clamping assembly 18 is cam actuated, as will be further discussed with reference to FIGS. 5 through 8. The clamping assembly 18 is for adjustably urging the flexible printed circuit contacts 13 into biased engagement with the elastomeric electrical connector 17, so that the elastomeric electrical connector 17 is held in biased contact with the rigid printed circuit contacts 13.

The shoe member 31 is rigid and composed of a nonconductive substance such as plastic. FIGS. 3 and 4 show the shoe member 31 disposed in the vertical tracking cavity 21 above the horizontal insertion aperture 26 to allow insertion of the flexible printed circuit terminal 15 into the vertical tracking cavity 21 at zero insertion force. It is vertically and slidably movable within the vertical tracking cavity 21. The shoe member 31 has horizontal dimensions substantially equal with those of the vertical tracking cavity 21 and has a vertical dimension small enough to allow insertion of the flexible printed circuit terminal 15 when the shoe member 31 is at its fully upward position in the vertical tracking cavity 21.

FIG. 2 shows the linear force jack 32 having a threaded rod member 33 and a screw member 34. The linear force jack 32 is rotatably connected to the base 19 by the top plate 20. Alternatively, it may be rotatably connected to the body structure 16 by a split retainer clip 38, as is shown in FIG. 1. The linear force jack 32 linearly adjusts the position of the shoe member 31 within the vertical tracking cavity 21 to provide a clamping function.

The screw member 34 is rigid, preferably constructed of metal, is hollow, and is interiorly threaded. Referring also to FIGS. 3 and 4, the screw member 34 has a knurled surface portion 37 for gripping, a shaft portion 36 and a base portion 35. The base portion 35 is circular in cross-section and is disposed in the vertical tracking cavity 21 so that it is seated in the linear force jack seating grooves 25 and vertically held in such position by the upper plate portion 20. The base portion 35 has an outside diameter such that it is seatable on the linear force jack seating notches 25. The shaft portion 36 is circular and concentric with the base portion 35. It extends vertically from the base portion 35, through the linear force jack retainer slot 24. The shaft portion 36 outside diameter is less than that of the base portion 35 and slightly less than that of the linear force jack retainer slot 24. Its length is preferably equivalent to the thickness of the top plate 20. The handle portion 37 is connected to the shaft portion 36 at its point of extension through the body structure 16. The handle portion 37 is preferably knurled for easy grasping and rotation by the user and has an outside diameter greater than that of the shaft portion 36.

The rod member 33 is rigid, preferably constructed of metal and is exteriorly threaded. It is fastened at one end to or integral with the top of the shoe member 31 at a central position as shown in FIG. 2. The rod member 33 has a length sufficient for it to extend the shoe member 31 throughout its range of movement in the vertical tracking cavity 21. It has a threaded diameter equivalent for use with the inside threaded diameter of the screw member 34 so that the rod member 33 is adjustably disposed in the interior of the screw member 34. Its position is variable by rotation of the screw member 34. Increased extension of the rod member 33 out of the screw member 34, therefore, causes the attached shoe member 31 to be extended downward in the vertical tracking cavity 21.

Figure 5:
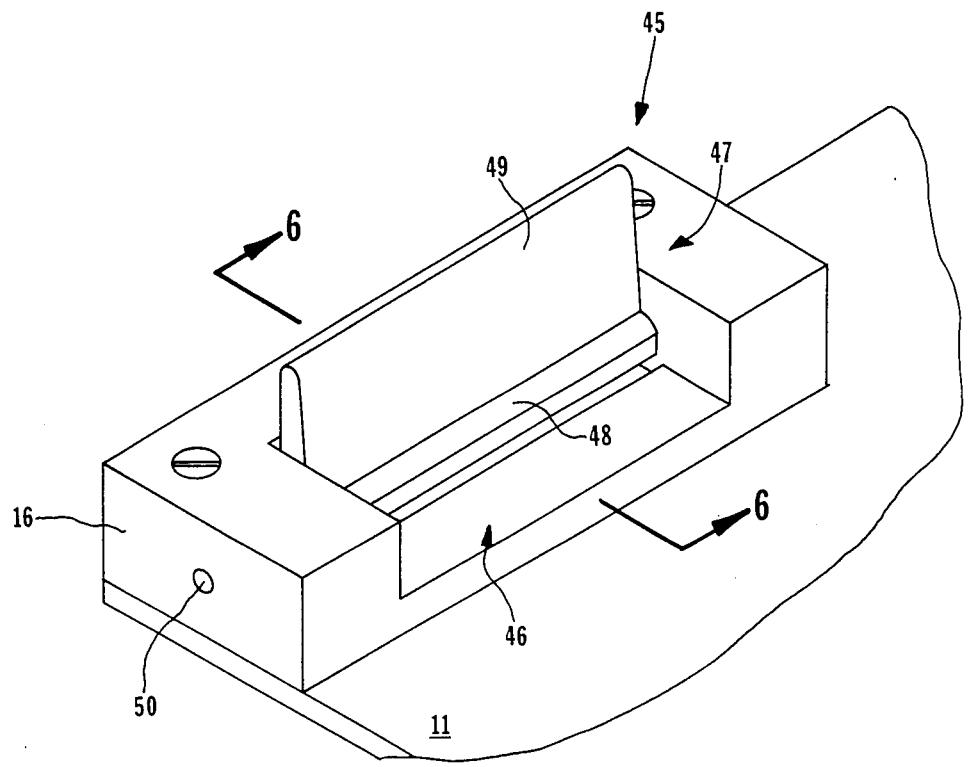
FIG. 5 is a perspective view of another embodiment of the connector assembly of the present invention showing a cam actuated clamping structure.

Referring to FIGS. 5 and 6, the clamping assembly 47 is shown to be cam actuated and having a cam portion 48 and a lever 49. The clamp assembly 47 rotates or pivots about rod 50 which is connected at both ends to the body structure 16 and axially disposed through the cam portion 48. The cam portion 48 is generally coextensive with and disposed above the elastomeric electrical conductor 17. In its open position, the lever 49 extends upwardly from the assembly 45. In this position, the planar face of the cam portion 48 is adjacent to the elastomeric connector 17, thus allowing insertion of the flexible circuit 12 into the vertical tracking cavity 21. In its down or clamped position, the lever 49 extends through the horizontal section 46. In this position, the cylindrical face of the cam 48 contacts the flexible circuit 12, holding it in contact with the elastomeric electrical connector 17.

Figure 7:
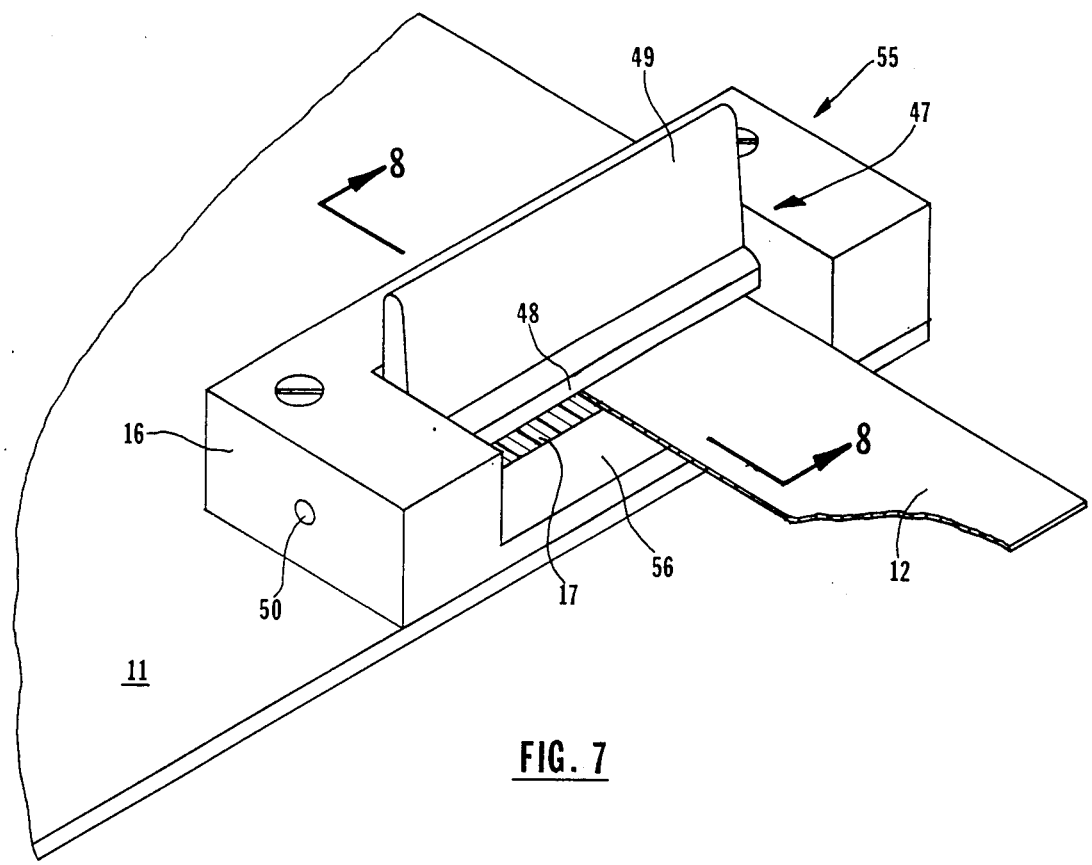
FIG. 7 is a perspective view of yet another embodiment of the connector assembly of the present invention and which also utilizes a cam actuated clamping structure.

Referring to FIGS. 7 and 8, another embodiment 55 of the connector assembly is shown. The embodiment 55 is similar to that shown in FIGS. 5 and 6 except that the flexible circuit insertion slot is disposed on the opposite side of the body structure 16 and is merged with the horizontal section or vertical cavity 46. Thus, the terminal end of the flexible circuit 12 is easily and quickly insertable into the insertion and alignment slot 56 to abut the rear interior wall 57 of the internal cavity 21 and beneath the cam portion 48. The subsequent movement of the cam lever 49 compressingly and releasably holds the contacts of the flexible circuit 12 in aligned electrical communication with the conductive contacts 13 of the rigid circuit 11 by means of the elastomeric electrical connector 17.

As many changes are possible to the embodiments of this invention utilizing the teachings thereof, the descriptions above, and the accompanying drawings should be interpreted in the illustrative and not the limited sense.

That which is claimed is:

1. A unitary connector and alignment assembly for electrically connecting flexible circuits to rigid circuits comprising:

a. an alignment structure having horizontal and vertical support and positioning means to align the flexible circuit for electrical communication with the rigid circuit, said alignment structure having a vertical aperture in its bottom extending inwardly and a unitary horizontal aperture in its side, said horizontal aperture extending inwardly without obstruction to open at said vertical aperture for ingress and egress of the flexible circuit, said alignment structure being mounted on the rigid circuit so that said vertical aperture covers the communicative portions of the rigid circuit;

b. an elastomeric vertical conductor disposed within said vertical aperture so that said elastomeric vertical conductor is between the inserted flexible circuit and the rigid circuit; and c. a hand operable clamping member connected to said alignment structure and moveable within said vertical aperture, above said elastomeric vertical conductor, to releasibly urge the flexible circuit and the rigid circuit into contact with said elastomeric vertical conductor.

2. The assembly of claim 1, wherein said alignment structure is comprised of a rectangular, non-conductive body additionally having a second vertical aperture in its top, said second vertical aperture being centrally disposed over and connected with said vertical aperture, said clamping member being extended through said second vertical aperture so that it prevents linear movement of said clamping member and permits rotation thereof.

3. The assembly of claim 2, wherein said second vertical aperture has horizontal dimensions coextensive with those of said vertical aperture and wherein said alignment structure additionally has a separable, coextensive upper structure disposed on its top, said upper structure having a clamping member retainer aperture generally disposed in its center so that it is aligned over said second vertical aperture, said clamping member retainer aperture engaging said clamping member so that it prevents linear movement of said clamping member and permits rotation thereof.

4. The assembly of claim 1, wherein said elastomeric vertical conductor has a plurality of vertically aligned conductive layers sandwiched between alternating non-conductive layers.

5. The assembly of claim 1, wherein said elastomeric vertical conductor is further disposed below the opening of said horizontal aperture to said vertical aperture to allow insertion of the flexible circuit into said vertical aperture at zero insertion force.

6. The assembly of claim 1, wherein said clamping member has a non-conductive clamping block for engaging the flexible circuit and hand-operable screw actuated linear force means connected to said clamping block for moving said clamping block into contact with the flexible circuit.

7. The assembly of claim 1, wherein said clamping member has a non-conductive cam for engaging the flexible circuit and a hand-operable lever connected to said cam for moving said cam into contact with the flexible circuit.

8. A zero insertion force connector assembly mountable on a rigid printed circuit board for receiving a flexible printed circuit, said assembly comprising:

a. a rectangular non-conductive body structure having a contact void, and an insertion aperture, said contact void being centered in and open to the bottom surface of said body structure, and extending inwardly therefrom to the top surface for enclosing the conductive network contacts of the rigid printed circuit board, said insertion aperture being disposed in the front surface of said body structure and extending inwardly at a right angle with and opening to said contact void for insertion of the flexible printed circuit parallel to the plane of the rigid printed circuit board, said connector assembly further having an upper body plate disposed on the top surface of said body structure and being generally coextensive therewith, said upper body plate having a retainer slot generally disposed in its center so that it is centrally aligned over said contact void, said body structure bottom surface being mountable on the rigid printed circuit board so that said contact void exposes the conductive network contacts of the rigid printed circuit board for contact with the inserted flexible printed circuit conductive network contacts;

b. a rectangular elastomeric electrical connector having a plurality of vertically conductive layers sandwiched between non-conductive layers, said elastomeric electrical connector being disposed in said contact void so that it contacts the rigid printed circuit board conductive network contacts and extends to a point immediately below said opening of said insertion aperture to said contact void; and c. a hand-operable clamping assembly having a clamping block disposed in and moveable within said contact void and further having a clamping jack connected to said clamping block and extending through said top aperture, said retainer slot engaging said clamping jack so that it prevents linear movement of said clamping jack and permits rotation thereof, said clamping jack adjustably urging said clamping block downward in said contact void to hold the inserted flexible printed circuit conductive network contacts in contact with said elastomeric electrical connector.

9. The connector assembly of claim 8, wherein said clamping jack linearly moves said clamping block and is screw actuated.

10. The connector assembly of claim 8, wherein said body structure is attachable to the rigid printed circuit board by screw means, and wherein said elastomeric vertical conductor has a plurality of vertically aligned conductive layers sandwiched between alternating non-conductive layers.

11. A connector and alignment assembly for electrically connecting flexible circuits to rigid circuits comprising:

a. a generally rectangular, nonconductive alignment structure for positioning the flexible circuit for electrical communication with the rigid circuit, said alignment structure having a vertical aperture in its bottom extending inwardly to its top, a horizontal aperture in its side, said horizontal aperture extending inwardly to open at said vertical aperture for ingress and egress of the flexible circuit, and a separable, coextensive upper structure disposed on its top, said upper structure having a retainer aperture generally disposed in its center so that it is aligned over said vertical aperture, said alignment structure being mountable on the rigid circuit so that said vertical aperture covers the communicative portions of the rigid circuit;
b. an elastomeric vertical conductor disposed within said vertical aperture so that said elastomeric vertical conductor is between the inserted flexible circuit and the rigid circuit; and
c. a clamping member connected to said alignment structure and movable within said vertical aperture, above said elastomeric vertical conductor, to releasibly urge the flexible circuit and the rigid circuit into contact with said elastomeric vertical conductor, said retainer aperture engaging said clamping member so that it prevents linear movement thereof and permits rotation thereof.

12. The connector and alignment assembly of claim 11, wherein said horizontal aperture is flaired at its outside periphery to guide the terminal end of the flexible circuit into the vertical aperture of said assembly.

13. The connector and alignment assembly of claim 11, wherein said elastomeric vertical conductor has a plurality of vertically aligned conductive layers which are separated by non-conductive layers, and is disposed between the flexible circuit and the rigid circuit for electrical communication therebetween.

* * * * *